(12) United States Patent
Yanagimachi et al.

(10) Patent No.: US 6,207,471 B1
(45) Date of Patent: Mar. 27, 2001

(54) METHOD OF PRODUCING SOLAR CELL DEVICE

(75) Inventors: Shinzo Yanagimachi, Higashimatsuyama; Satoshi Nakayama, Tokorozawa, both of (JP)

(73) Assignee: Citizen Watch, Co., LTD, Tokyo (JP)

( * ) Notice: Subject to any disclaimer, the term of this patent is extended or adjusted under 35 U.S.C. 154(b) by 0 days.

(21) Appl. No.: 09/381,800

(22) PCT Filed: Jan. 22, 1999

(86) PCT No.: PCT/JP99/00257

§ 371 Date: Sep. 24, 1999

§ 102(e) Date: Sep. 24, 1999

(87) PCT Pub. No.: WO99/39390

PCT Pub. Date: Aug. 5, 1999

(30) Foreign Application Priority Data

Jan. 28, 1998 (JP) .................................................. 10-015486

(51) Int. Cl.[7] ........................ H01L 21/00; H01L 21/302; H01L 21/461
(52) U.S. Cl. ............................ 438/57; 438/690; 438/720; 438/722
(58) Field of Search ............................. 438/57, 906, 905, 438/690, 706, 707, 708, 709, 710, 714, 720, 722, 726; 29/890.033

(56) References Cited

U.S. PATENT DOCUMENTS 5,668,050 * 9/1997 Iwasaki ................................... 438/69
5,766,964 * 6/1998 Rohatgi et al. ........................ 437/2
6,037,017 * 3/2000 Kashiro ................................ 427/579

FOREIGN PATENT DOCUMENTS 2-63121  3/1990 (JP) .
5-267701 10/1993 (JP) .
7-202232  8/1995 (JP) .

* cited by examiner

*Primary Examiner*—Matthew Smith
*Assistant Examiner*—Lex H Malsawma
(74) *Attorney, Agent, or Firm*—Armstrong, Westerman, Hattori, McLeland & Naughton

(57) ABSTRACT

A fabricating method for a solar cell device (2) comprises the steps of: forming a transparent oxide electrode (12) on the surface of an insulating substrate (10); cleaning the surfaces of the insulating substrate (10) and the transparent oxide electrode (12) with a halogen gas having a saturated vapor pressure higher than that of etching gas in providing the transparent oxide electrode (12); and forming a laminated structure by laminating a surface treatment layer (14), a silicon nitride film (16), a p-type semiconductor layer (18), a buffer layer (20), an intrinsic semiconductor layer (22), an n-type semiconductor layer (24), and a metal electrode (26) in order. Through the above fabricating method, having the step of cleaning the surfaces of the insulating substrate (10) and the transparent oxide electrode (12), the surfaces are made clean to be high in transparency, thereby obtaining a required amount of transmitted light.

5 Claims, 8 Drawing Sheets

F I G. 1 3
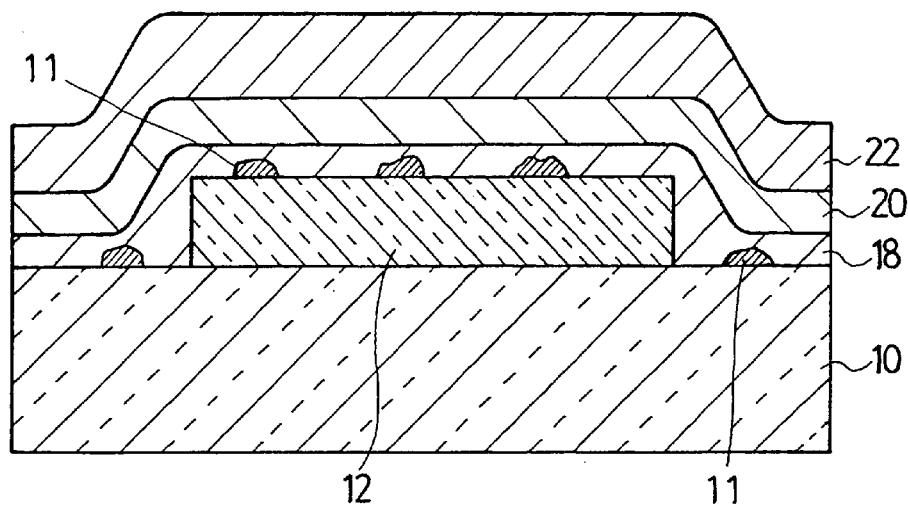
F I G. 1 4
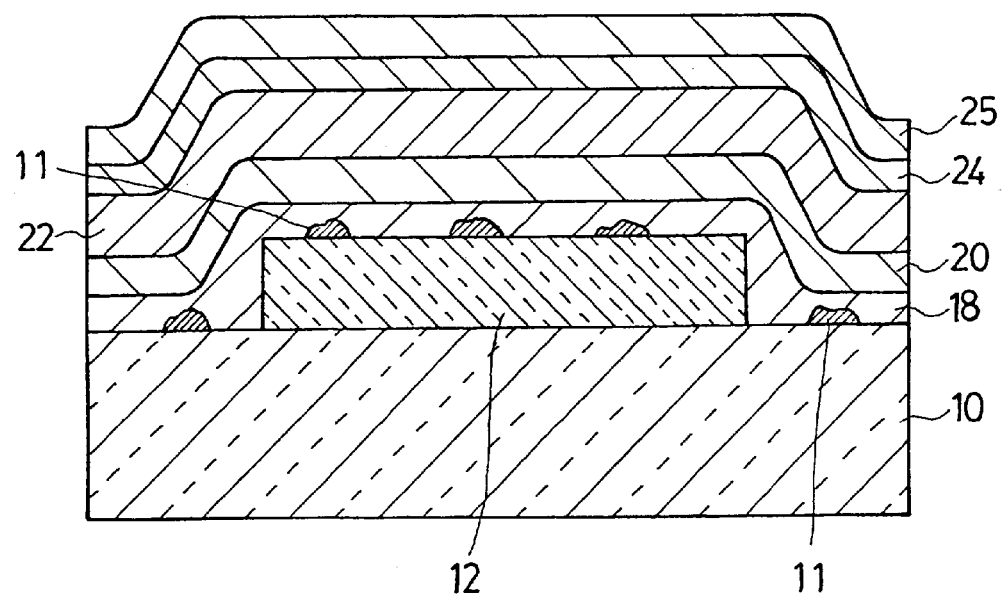

METHOD OF PRODUCING SOLAR CELL DEVICE

TECHNICAL FIELD

The present invention relates to a fabricating method for a solar cell device for giving a required amount of transmitted light to semiconductor layers by obtaining a clean insulating substrate surface and transparent oxide electrode surface.

BACKGROUND TECHNOLOGY

FIG. 10 is a sectional view showing the structure of a conventional solar cell device 102.

The solar cell device 102 has a structure in which a transparent oxide electrode 12 is formed on the surface of an insulating substrate 10 which is a transparent glass substrate, and a p-type semiconductor layer 18, a buffer layer 20, an intrinsic semiconductor layer 22, an n-type semiconductor layer 24, and a metal electrode 26 are laminated in order on to the surface of the transparent oxide electrode 12 into a laminated structure.

The insulating substrate 10 transmits light incident from the surface on the side thereof (the lower side in the drawing), on which the transparent oxide electrode 12 is not formed, to the transparent oxide electrode 12.

The transparent oxide electrode 12 is formed to lead light (mainly sunlight) incident through the insulating substrate 10 to the intrinsic semiconductor layer 22 through the p-type semiconductor layer 18 and the buffer layer 20 and to keep ohmic contact with the p-type semiconductor layer 18.

The p-type semiconductor layer 18 is a layer composed of a p-type semiconductor, which is provided to lead carriers, produced in the intrinsic semiconductor layer 22 by the incident light, to the transparent oxide electrode 12. The buffer layer 20 functions as a buffer layer for preventing a forbidden band width of the intrinsic semiconductor layer 22 from narrowing due to the mixing of p-type impurities (boron) contained in the p-type semiconductor layer 18, into the intrinsic semiconductor layer 22. The intrinsic semiconductor layer 22 is a layer made of an intrinsic semiconductor for producing carriers by absorbing the incident light. The n-type semiconductor layer 24 is a layer made of an n-type semiconductor provided to lead the carriers produced in the intrinsic semiconductor layer 22 to the metal electrode 26. The metal electrode 26 is connected with an interconnection for taking out electromotive force.

Next, the fabricating method for the aforesaid conventional solar cell device will be described using FIG. 11 through FIG. 15.

First, tin oxide film is formed on the insulating substrate 10 to form a transparent oxide electrode 12, and thereafter a photoresist 13 is applied on the entire surface of the tin oxide film. The photoresist 13 is exposed and developed with a predetermined mask to remain in a region which is to be the solar cell device 102.

Next, as shown in FIG. 11, the transparent oxide electrode 12 is etched by means of a reactive ion etching system with the above photoresist 13 as an etching mask and with hydrogen iodide (HI) and argon (Ar) used as the raw material gas. Removing the photoresist 13 makes a state where the transparent oxide electrode 12 is provided on the surface of the insulating substrate 10 as shown in FIG. 12.

Subsequently, the p-type semiconductor layer 18 is formed on the entire surface of the insulating substrate 10 so as to cover the transparent oxide electrode 12, as shown in FIG. 13, by the plasma CVD (chemical-vapor deposition) method. At this time, mono-silane ($SiH_4$) and diborane ($B_2H_6$) are used as the raw material gas. Methane gas ($CH_4$) is simultaneously introduced to form silicon carbide in the p-type semiconductor layer 18, thereby preventing the forbidden band width of the p-type semiconductor layer 18 from narrowing and the light converting efficiency from lowering. The buffer layer 20 is then formed over the entire surface of the p-type semiconductor layer 18. This is carried out by the plasma CVD method with mono-silane ($SiH_4$) and methane gas ($CH_4$). The intrinsic semiconductor layer 22 is next formed on the entire surface of the buffer layer 20. This is also carried out by the plasma CVD method with mono-silane ($SiH_4$) as the raw material gas.

Moreover, as shown in FIG. 14, the n-type semiconductor layer 24 is formed on the entire surface of the intrinsic semiconductor layer 22. This is performed by the plasma CVD method with mono-silane ($SiH_4$) and phosphine ($PH_3$) as the raw material gas. Thereafter, a metal film 25 which becomes the metal electrode 26 is formed on the entire surface of the n-type semiconductor layer 24 by the sputtering method and a photoresist 15 is applied on the entire surface of the metal film 25.

The photoresist 15 is exposed and developed with a predetermined mask, as shown in FIG. 15, to remain only in a region which is to be the solar cell device 102. Then, the metal film 25 and the respective layers laminated thereunder are etched and removed by the reactive ion etching method using the photoresist 15 as an etching mask, and the photoresist 15 used for the etching mask is also removed.

Consequently, the solar cell device 102 can be fabricated as shown in FIG. 10, in which all layers from the p-type semiconductor layer 18, the buffer layer 20, the intrinsic semiconductor layer 22, the n-type semiconductor layer 24 to the metal electrode 26 are laminated in order on the transparent oxide electrode 12.

Although the solar cell device 102 can be fabricated by the above fabricating method, the solar cell device 102 has the following disadvantages which are due to the use of tin oxide as a material for the transparent oxide electrode 12. Tin oxide can be etched by means of the reactive ion etching system with hydrogen iodide (HI), hydrogen bromide (HBr), hydrogen chloride (HCl) or the like as the raw material gas. Hydrogen iodide is especially superior in etching properties, thus obtaining a high etching rate. However, there is a disadvantage that the use of hydrogen iodide produces tin iodide series compounds 11 through the etching, which adhere to the inside of a reaction chamber of the reactive ion etching system and to the insulating substrate 10 and the transparent oxide electrode 12 as shown in FIG. 10 to FIG. 15 to cause contamination, thereby reducing yields of the solar cell device. When contamination of the insulating substrate 10 and the transparent oxide electrode 12 occurs, the amount of transmitted light is decreased, which lowers electric power taken out. Therefore, the eliminating of the above contamination is an extremely important subject in terms of enhancement of output characteristics of a solar cell.

The object of the present invention is to fabricate a solar cell device for giving a required amount of transmitted light to semiconductor layers by solving the above disadvantages to obtain a clean insulating substrate surface and transparent oxide electrode surface in a fabricating method for a solar cell device.

DISCLOSURE OF THE INVENTION

To achieve the above object, the present invention is characterized by a fabricating method which comprises the steps of: forming a transparent oxide electrode by etching a metal film formed on an insulating substrate; cleaning the surfaces of the insulating substrate and the transparent oxide electrode with a halogen gas having a saturated vapor pressure higher than that of etching gas in the step of forming the transparent oxide electrode; forming a p-type semiconductor layer, an intrinsic semiconductor layer, and an n-type semiconductor layer over the surface of the transparent oxide electrode in order; and forming a metal electrode on the n-type semiconductor layer.

When a solar cell device is fabricated by the above fabricating method, the surfaces of the insulating substrate and the transparent oxide electrode are made clean so as to be high in transparency. Therefore, a required amount of transmitted light can be obtained.

Moreover, it is possible that a fabricating method for a solar cell device comprises the steps of: forming a transparent oxide electrode by etching a metal film formed on an insulating substrate; cleaning the surfaces of the insulating substrate and the transparent oxide electrode with pure water; forming a p-type semiconductor layer, an intrinsic semiconductor layer, and an n-type semiconductor layer over the surface of the transparent oxide electrode in order; and forming a metal electrode on the n-type semiconductor layer.

Furthermore, it is preferable that a fabricating method for a solar cell device further comprises the step of cleaning the surfaces of the insulating substrate and the transparent oxide electrode with pure water after or before the step of cleaning the surfaces of the insulating substrate and the transparent oxide electrode.

It is possible that the step of cleaning the surfaces of the insulating substrate and the transparent oxide electrode with pure water is the step of cleaning the insulating substrate and the transparent oxide electrode by rocking them in a water bath applied with ultrasound.

BRIEF DESCRIPTION OF DRAWINGS

FIG. 11 to FIG. 15 are sectional views showing respective steps of a fabricating method of the conventional solar cell device.

BEST MODE FOR CARRYING OUT THE INVENTION

The best mode for embodying a fabricating method for a solar cell device according to the present invention will be described in detail hereinafter, using the accompanying drawings.

Figure 1:
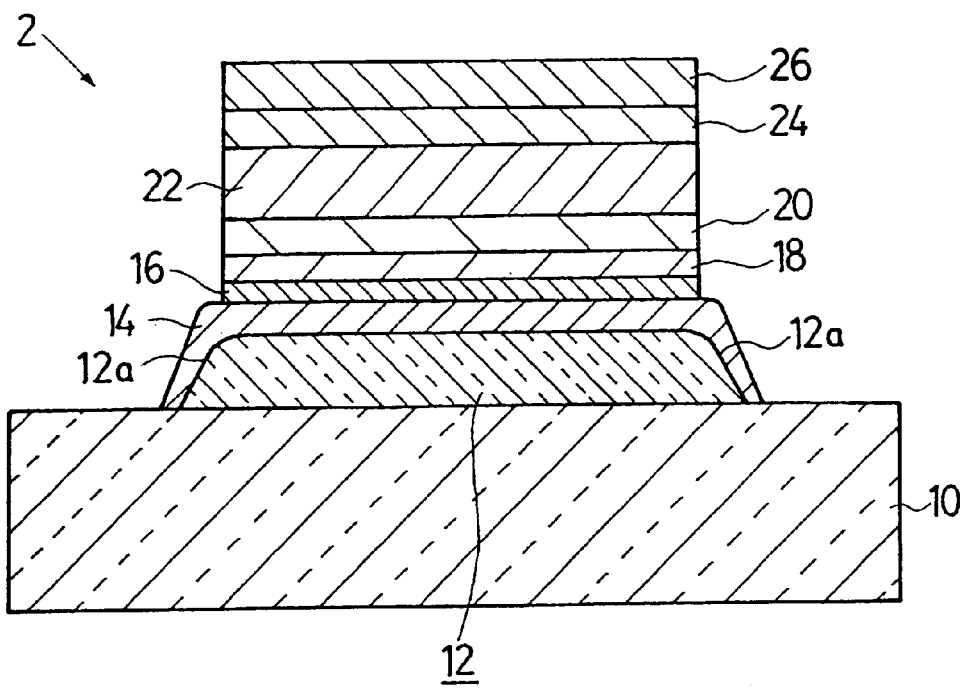
FIG. 1 is a sectional view showing the structure of a solar cell device obtained according to a fabricating method of the best mode of the present invention.

Structure of the Solar Cell Device: FIG. 1

Figure 10:
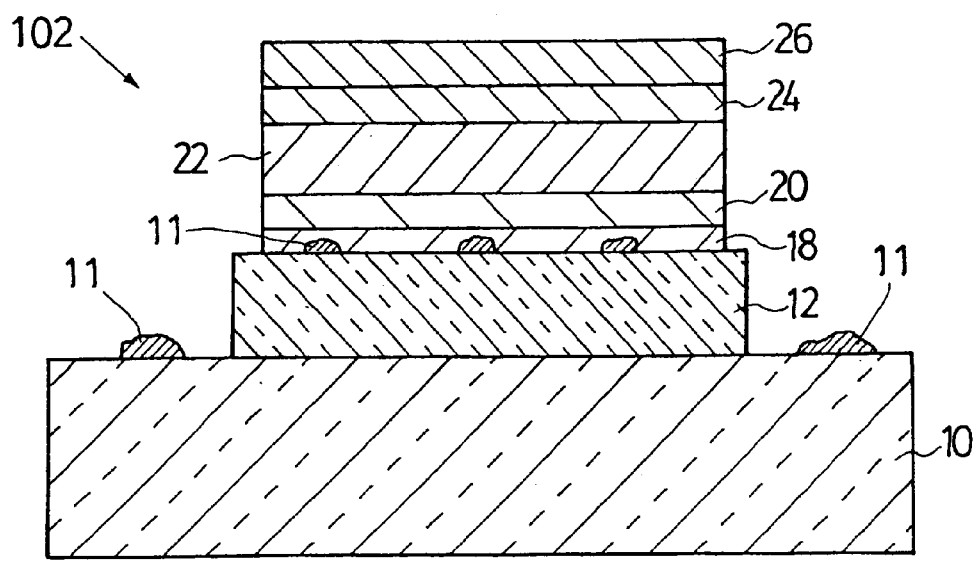
FIG. 10 is a sectional view showing the structure of a conventional solar cell device.
Figure 11:
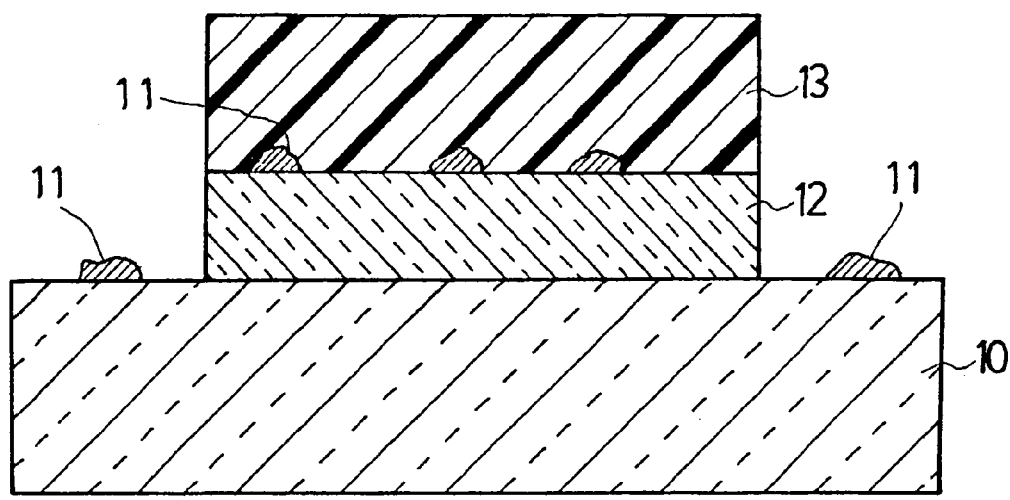
Figure 12:
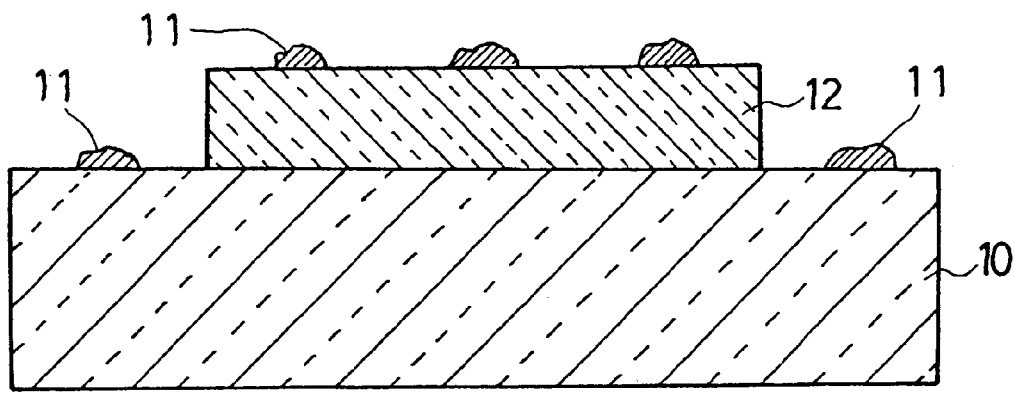
Figure 15:
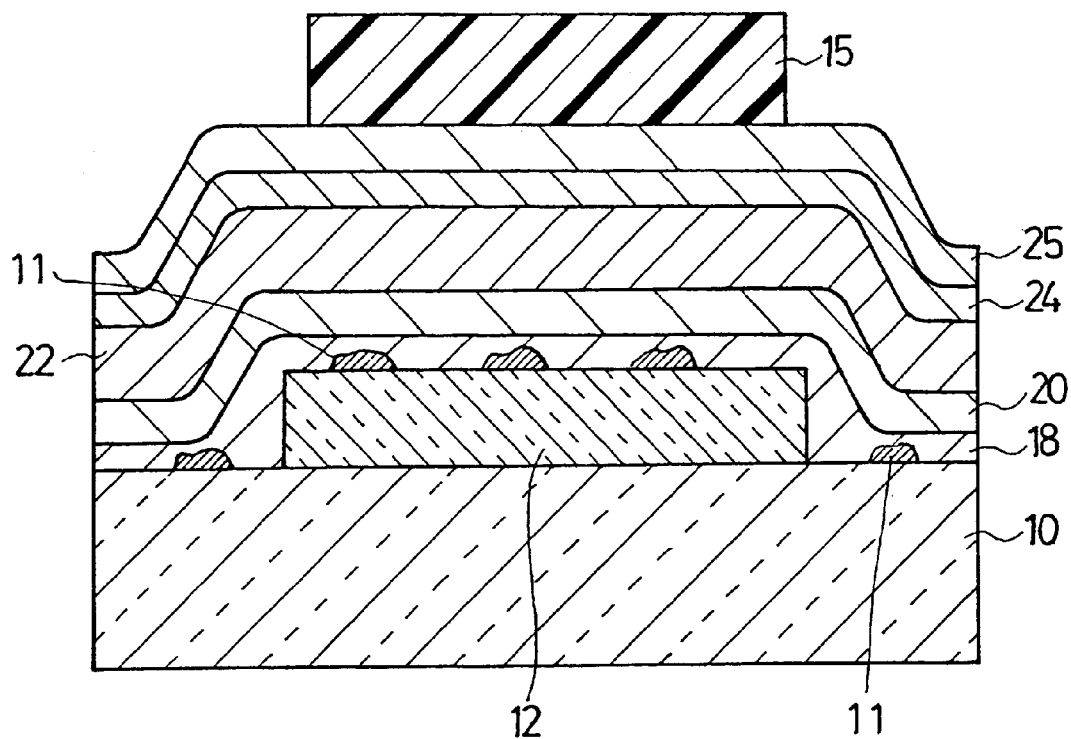

First, the solar cell device fabricated according to the present invention will be explained with reference to FIG. 1. It should be noted that the same structures as those in the conventional solar cell device shown in FIG. 10 are given the same numerals and symbols for explanation. FIG. 1 is a sectional view showing the structure of the solar cell device fabricated according to the present invention.

As shown in FIG. 1, the solar cell device 2 has a structure in which a transparent oxide electrode 12 is provided on the surface of an insulating substrate 10 which is a transparent glass substrate, the surface of the transparent oxide electrode 12 undergoes oxidative plasma treatment to provide a surface treatment layer 14, on which a silicon nitride film 16 is provided, and a p-type semiconductor layer 18, a buffer layer 20, an intrinsic semiconductor layer 22, an n-type semiconductor layer 24, and a metal electrode 26 are laminated in order on the surface of the silicon nitride film 16 into a laminated structure.

The insulating substrate 10 is shaped into a plate having a suitable size in width and depth and a suitable thickness and transmits light incident from the surface on the side thereof (the lower side in the drawing), on which the transparent oxide electrode 12 is not formed, to the transparent oxide electrode 12.

The transparent oxide electrode 12 is formed to lead light (mainly sunlight) incident through the insulating substrate 10 to the intrinsic semiconductor layer 22 through the surface treatment layer 14, the silicon nitride film 16, the p-type semiconductor layer 18, and the buffer layer 20, and to keep ohmic contact with the p-type semiconductor layer 18, and is connected with an interconnection for taking out generated electromotive force to the outside thereof.

As shown in FIG. 1, the transparent oxide electrode 12 is formed in a tapered shape in which side faces 12a which the p-type semiconductor layer 18 is not provided thereon, are gradually inclined outward from the top end thereof toward the insulating substrate 10. Thereby, a break in the interconnection and a short circuit of the metal electrode 26 is prevented.

On the surface of the transparent oxide electrode 12, the surface treatment layer 14 is formed by performing oxidative plasma treatment. The surface treatment layer 14 functions as a surface stabilizing layer for retarding the reduction of the transparent oxide electrode 12 and for chemically stabilizing the surface of the transparent oxide electrode 12 to improve characteristics of the solar cell device 2. More specifically, the oxidative plasma treatment allows oxygen atoms contained in the surface treatment layer 14 formed by the oxygen atom plasma to unite with not-yet-united tin atoms appearing on the surface of the transparent oxide electrode 12, thereby retarding the union of impurities (boron) contained in the p-type semiconductor layer 18 and the not-yet-united tin atoms (retardation of the reduction). Accordingly, the surface treatment layer 14 stabilizes the surface of the transparent oxide electrode 12.

The silicon nitride film 16 is formed to prevent mutual diffusion between the transparent oxide electrode 12 and the p-type semiconductor layer 18 and to prevent the reflection of incident sunlight in order to allow sunlight to efficiently stream into the intrinsic semiconductor layer 22.

The p-type semiconductor layer 18 is a layer composed of a p-type semiconductor which is provided to form an internal electric field for leading carriers produced in the intrinsic semiconductor layer 22 by incident light to the transparent oxide electrode 12.

The buffer layer 20 functions as a buffer layer for preventing a forbidden band width of the intrinsic semiconductor layer 22 from narrowing due to the mixing of the p-type impurities (boron) contained in the p-type semiconductor layer 18 into the intrinsic semiconductor layer 22 and for preventing light absorption efficiency from lowering. The intrinsic semiconductor layer 22 is a layer made of an intrinsic semiconductor for producing carriers (pairs of electron and hole) in correspondence with the absorbed energy of incident light. The n-type semiconductor layer 24 is a layer composed of an n-type semiconductor provided to form an internal electric field for leading the carriers produced in the intrinsic semiconductor layer 22 to the metal electrode 26. The metal electrode 26 is connected with an interconnection for taking out electromotive force.

Figure 2:
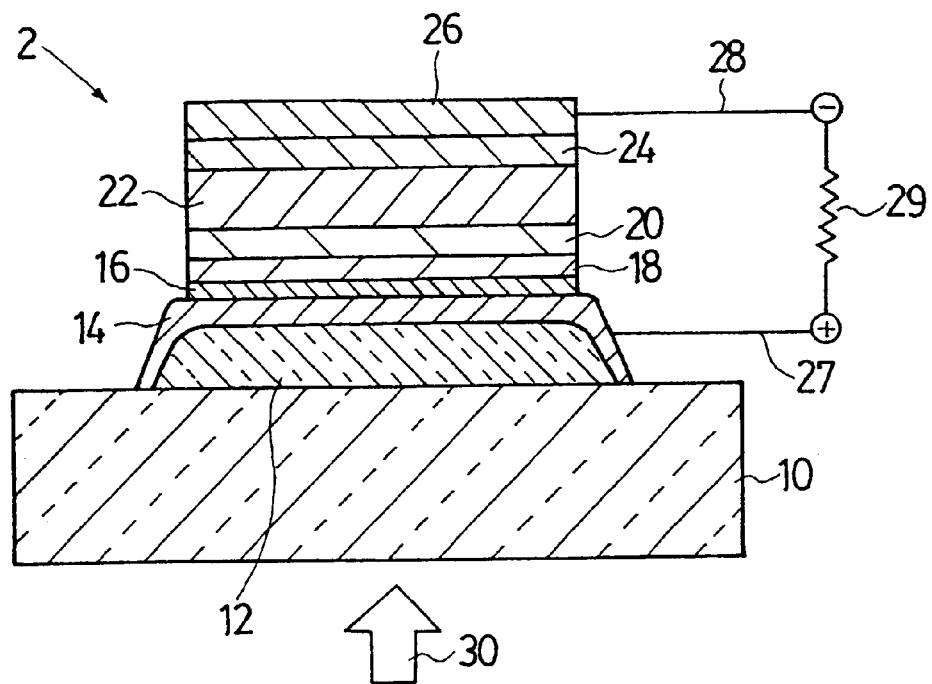
FIG. 2 is a sectional view showing the solar cell device shown in FIG. 1 in service.

The solar cell device 2 having such a structure is used as shown in FIG. 2. More specifically, an interconnection code 27 is connected with the surface of the transparent oxide electrode 12 via the surface treatment layer 14 and an interconnection code 28 is connected with the metal electrode 26, and a load resistance 29 is connected with the interconnection codes 27 and 28.

After light 30 streams in from the rear face, which is not provided with the transparent oxide electrode 12, of the insulating substrate 10, the incident light 30 reaches to the intrinsic semiconductor layer 22 from the transparent oxide electrode 12 through the surface treatment layer 14, the silicon nitride film 16, the p-type semiconductor layer 18 and the buffer layer 20. By receiving energy of the light 30, pairs of electrons and holes are produced in the intrinsic semiconductor layer 22. The pairs of electrons and holes are separated by an electric field formed by the p-type semiconductor layer 18 and the n-type semiconductor layer 24, whereby electromotive force appears in the transparent oxide electrode 12 and the metal electrode 26. The electromotive force can be taken out of the load resistance 29 connected with the solar cell device 2 via the interconnection codes 27 and 28. As a consequence, energy of incident light comes to be converted into electric energy.

In this case, since the transparent oxide electrode 12 is provided with the surface treatment layer 14 formed by oxidative plasma treatment on its surface, it is chemically stable by virtue of retardation of the reduction on the surface thereof. Accordingly, the transmittance of the transparent oxide electrode 12 does not lower and the film quality of a amorphous semiconductor layer does not deteriorate, thus improving open circuit voltage to obtain preferable output characteristics as a solar cell device. Moreover, the provision of the silicon nitride film 16 can further stabilize the film quality of the transparent oxide electrode 12, thereby further improving open circuit voltage.

Fabricating method for the solar cell device: FIG. 3 to FIG. 9 and FIG. 1

Next, the fabricating method for the solar cell device according to an embodiment of the present invention will be described in detail, using FIG. 3 to FIG. 9 and FIG. 1.

Figure 3:
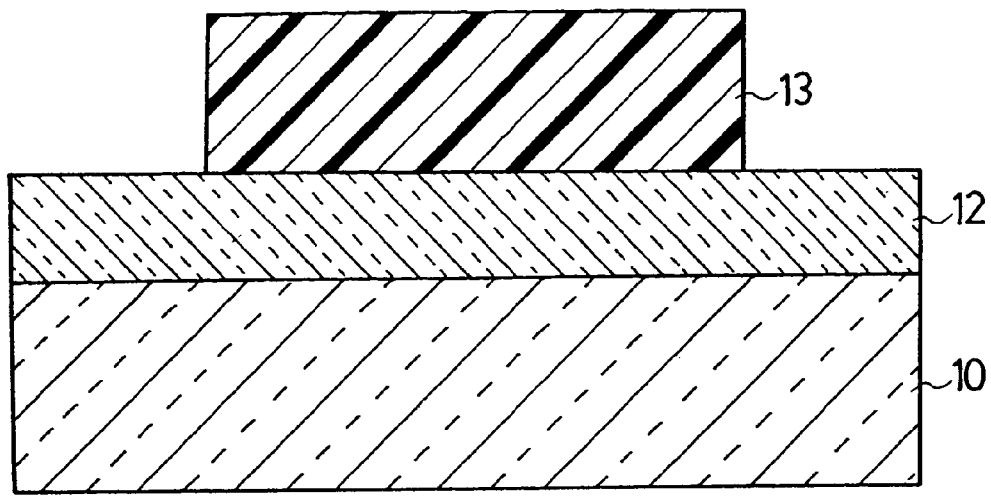
FIG. 3 to FIG. 9 are sectional views showing respective steps of the fabricating method for the solar cell device according to the best mode of the present invention.

First, tin oxide film is formed to form the transparent oxide electrode 12 on the insulating substrate 10 as shown in FIG. 3. The above film is formed with a thickness approximately 900 nm by the CVD method. Then, the photoresist 13 with the film thickness of about 2.3 $\mu$m is applied over the entire surface of the insulating substrate 10 on which tin oxide film is formed, thereafter the photoresist 13 is exposed and developed with a predetermined mask so as to remain in a region which will become the solar cell device 2.

Figure 4:
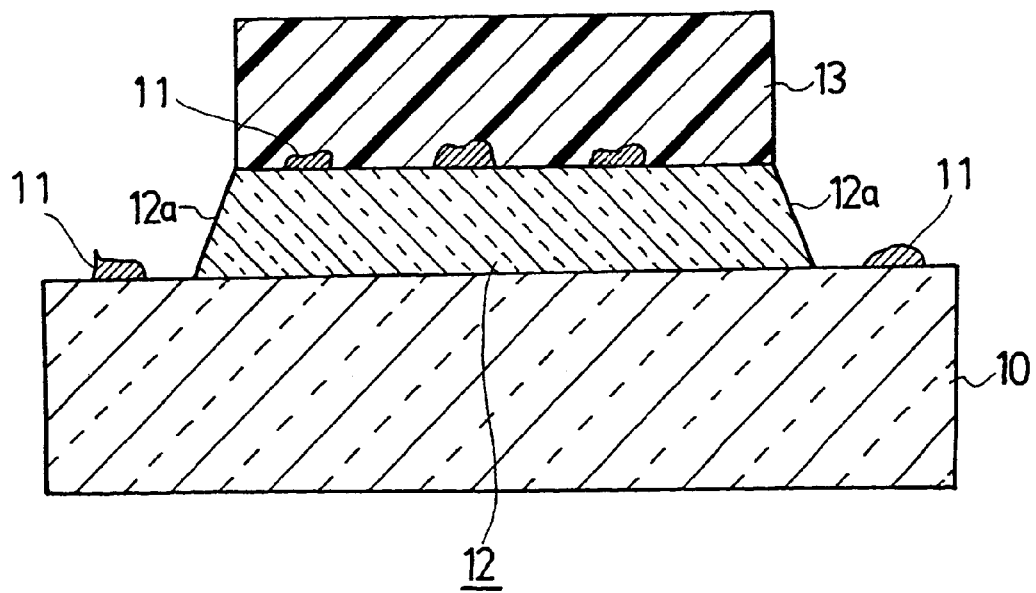

Next, as shown in FIG. 4, the tin oxide film is etched under the following conditions with the above photoresist 13 as an etching mask. Hydrogen iodide (HI) and argon (Ar) are used as etching gas and introduced into a reaction chamber of the reactive ion etching system at a flow ratio of 3:1. By applying microwave electric power of frequency of 2.45 GHz at 1 kW and radio-frequency electric power of frequency of 13.56 MHz at 300 W, while the insulating substrate 10 is cooled at 15° C., the reaction chamber pressure is made 10 mTorr. The tin oxide film formed on the above conditions is etched to pattern. At this time, the insulating substrate 10 is cooled, whereby a selection ratio between the insulating substrate 10 and the photoresist 13 can be improved.

Figure 5:
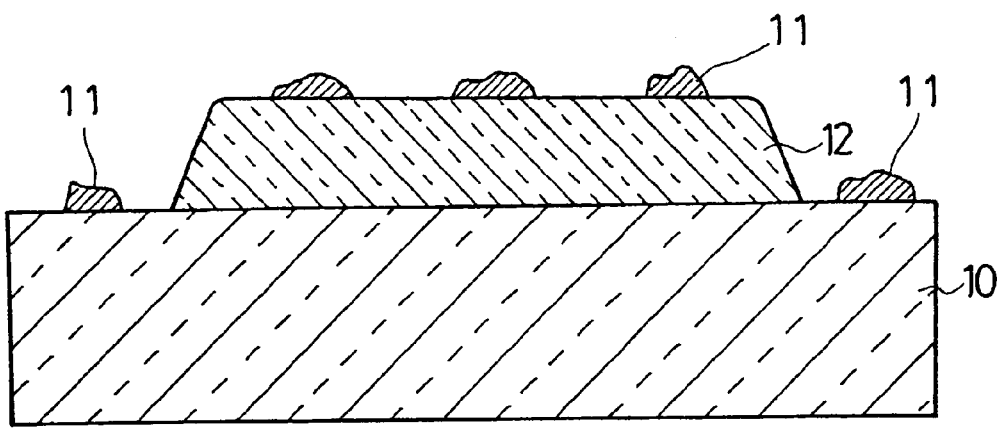

The etching in this case is performed in such a manner that the side faces 12a, which are not covered with the photoresist 13, of the transparent oxide electrode 12 are tapered in a shape gradually inclined outward from the top end thereof toward the insulating substrate 10 as shown in FIG. 5, in order to prevent a break in the interconnection and a short circuit of the metal electrode 26.

Removing the photoresist 13, a state where the transparent oxide electrode 12 is provided on the insulating substrate 10 can be obtained. However, since the tin oxide film is etched using hydrogen iodide for etching gas, tin iodide series compounds 11 adhere to the insulating substrate 10 and the transparent oxide electrode 12 to cause contamination. Therefore, the insulating substrate 10 and the transparent oxide electrode 12 are cleaned as follows.

That is, hydrogen chloride (HCl) which is a halogen series gas having a saturated vapor pressure higher than that of hydrogen iodide (HI) which is the etching gas of characteristics of the present invention and argon (Ar), are introduced as raw material gas into a reaction chamber of the reactive ion etching system at a flow ratio of 5:1. By applying microwave electric power of frequency of 2.45 GHz at 1 kW and radio-frequency electric power of 13.56 MHz at 300 W, the reaction chamber pressure is made 10 mTorr. Plasma is generated under the above conditions to clean the surfaces of the insulating substrate 10 and the transparent oxide electrode 12. Consequently, the adhering tin iodide series compounds 11 are removed, thus making the above surfaces clean. Incidentally, hydrogen bromide (HBr) may be used in place of hydrogen chloride (HCl) as a halogen series gas having a saturated vapor pressure higher than that of hydrogen iodide (HI).

The reason why the tin iodide series compounds 11 are removed through the above cleaning step is thought to be as follows. When hydrogen chloride or hydrogen bromide are used in cleaning, for instance, hydrogen chloride is used, tin (Sn) composing the tin iodide series compounds 11 combines with chlorine composing hydrogen chloride to become tin chloride (SnCl), and iodine (I) combines with hydrogen to become hydrogen iodide (HI). Tin chloride produced at this time, having a higher saturated vapor pressure than tin iodide, exhibits a large difference between its saturated vapor pressure and the etching pressure in the reaction chamber of the reactive ion etching system. Therefore, tin chloride and hydrogen iodide produced through etching do not stay with adhering to the surfaces of the insulating substrate 10 and the transparent oxide electrode 12 and are discharged to the outside of the reaction chamber. Consequently, the tin iodide series compounds 11 react with hydrogen chloride to change into tin chloride (SnCl) and iodine (I) to be discharged during the step of cleaning, thereby obtaining a state where the surfaces of the insulating substrate 10 and the transparent oxide electrode 12 are cleaned.

On the other hand, the tin iodide compound 11 has the property of being soluble in pure water. Therefore, it is possible to clean the surfaces of the insulating substrate 10 and the transparent oxide electrode 12 with pure water, in the aforesaid cleaning method. This cleaning method is a method in which after the transparent oxide electrode 12 is formed, the insulating substrate 10 is taken out of the reaction chamber and rocked in a water bath applied with ultrasound for about five minutes. By repeating the above cleaning operation twice, clean surfaces of the insulating substrate 10 and the transparent oxide electrode 12 which are free from the tin iodide series compounds 11 can be obtained from a state where the tin iodide series compounds 11 adhere to the surfaces.

Figure 6:
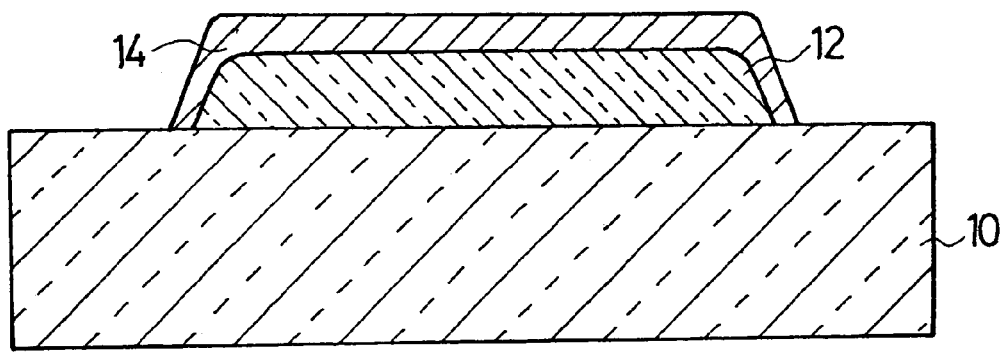

Next, oxidative plasma treatment is performed for the transparent oxide electrode 12 cleaned through the above cleaning step to stabilize the surface thereof to form the surface treatment layer 14. The oxidative plasma treatment is carried out by exposing the transparent oxide electrode 12 to a plasma atmosphere applied with radio-frequency electric power of about 13.56 MHz at 300 W with raw material gas comprised of oxygen ($O_2$) and argon (Ar) at a flow ratio of 6:1. As shown in FIG. 6, the surface treatment layer 14 having the film thickness of several nm performed the oxidative plasma treatment is formed not only on the cleaned transparent oxide electrode 12 but also on the side faces 12a.

Figure 7:
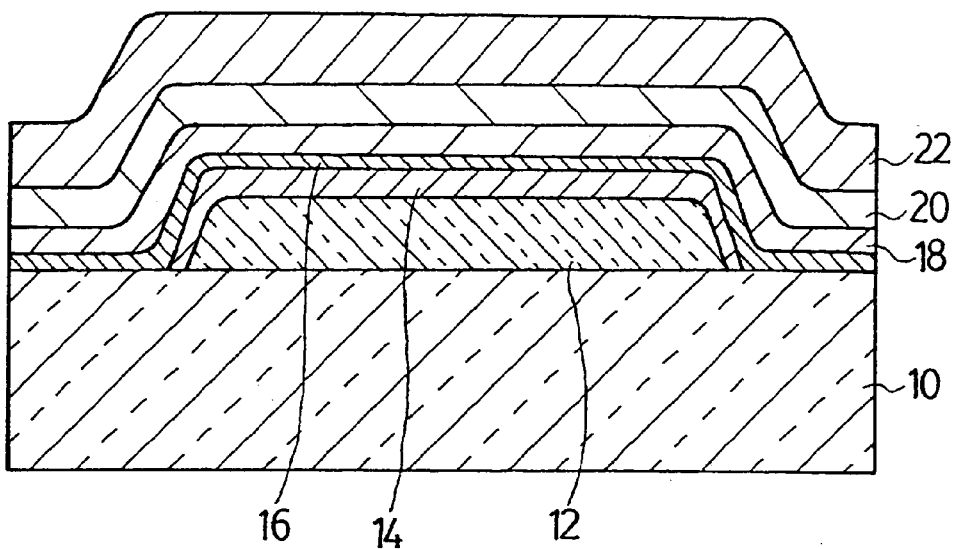

Moreover, as shown in FIG. 7, the silicon nitride film 16 for preventing reflection of incident sunlight is formed with a thickness of about 2 nm over the entire surface of the insulating substrate 10. This treatment is carried out by the plasma CVD (chemical-vapor deposition) method with radio-frequency discharge of about 13.56 MHz, using mono-silane ($SiH_4$) and nitrogen ($N_2$) as the raw material gas.

Thereafter, the p-type semiconductor layer 18 is formed over the entire surface of the insulating substrate 10 in such a manner to cover the silicon nitride film 16 by the plasma CVD (chemical-vapor deposition) method. At this time, mono-silane ($SiH_4$) and diborane ($B_2H_6$) are used as the raw material gas and the film thickness of the p-type semiconductor layer 18 is made about 10 nm. Simultaneously, methane gas ($CH_4$) is introduced to make silicon carbide in the p-type semiconductor layer 18, thereby preventing the forbidden band width of the p-type semiconductor layer 18 from narrowing and preventing the light converting efficiency from lowering. The buffer layer 20 is then formed on the entire surface of the p-type semiconductor layer 18. This is carried out by the plasma CVD method with mono-silane ($SiH_4$), methane gas ($CH_4$) and hydrogen ($H_2$) used as the raw material gas, and the film thickness of the buffer layer 20 is made to be about 13 nm. The intrinsic semiconductor layer 22 is next formed on the entire surface of the buffer layer 20. This is also carried out by the plasma CVD method with mono-silane ($SiH_4$) as the raw material gas. The film thickness of the intrinsic semiconductor layer 22 is made to be about 600 nm.

Figure 8:
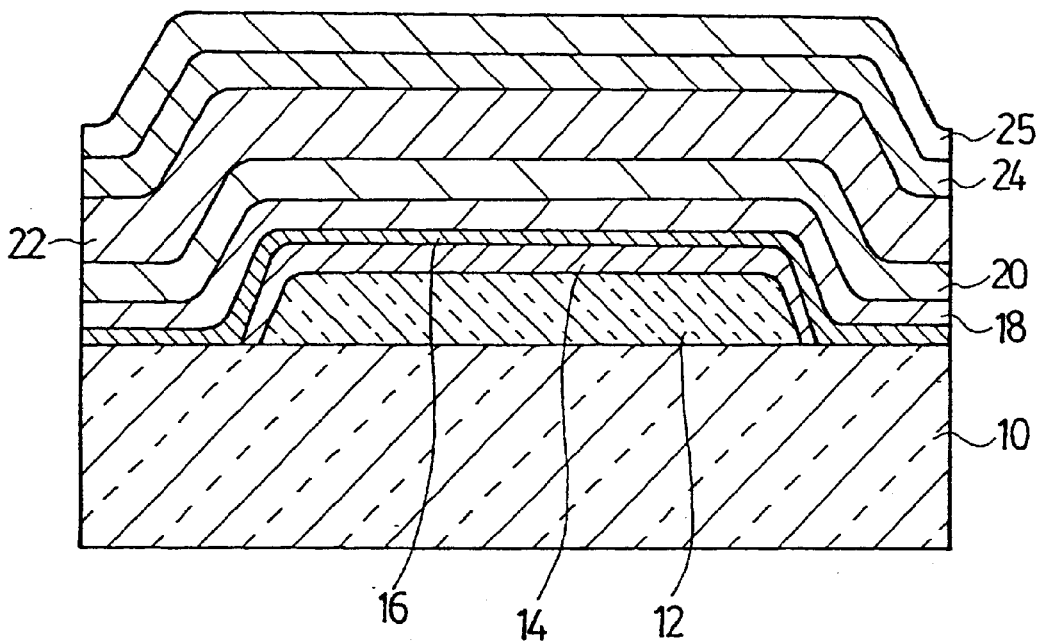

Furthermore, as shown in FIG. 8, the n-type semiconductor layer 24 is formed on the entire surface of the intrinsic semiconductor layer 22. This is performed by the plasma CVD method with mono-silane ($SiH_4$) and phosphine ($PH_3$) as the raw material gas, in such a manner to grow the n-type semiconductor layer 24 up to about 40 nm in film thickness. Then, the metal film 25 for the metal electrode 26 is formed on the entire surface of the n-type semiconductor layer 24 by the sputtering method. The metal film 25 is formed to be about 200 nm in film thickness with titanium (Ti) as the raw material. Thereafter, a photoresist 17 is applied on the entire surface of the metal film 25 to be about 1.2 $\mu$m in film thickness by the spin coating method.

Figure 9:
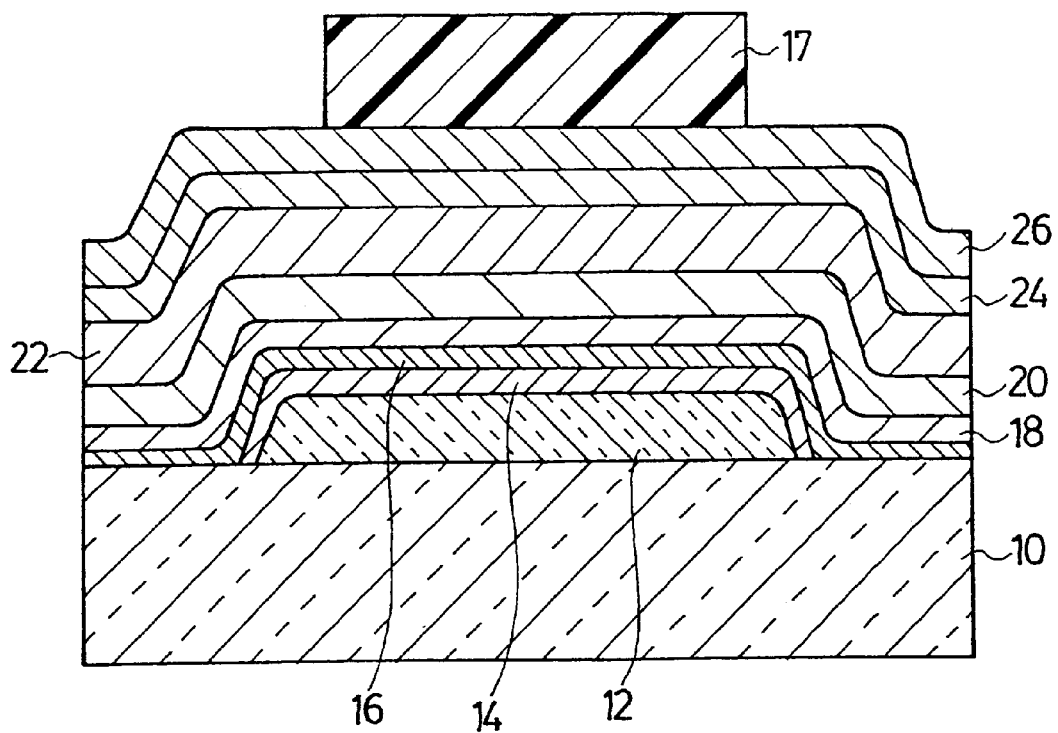

Exposure and processing are performed for the photoresist 17 with a predetermined mask, whereby the photoresist 17 is patterned so as to remain only in a region that will become the solar cell device 2 as shown in FIG. 9. Subsequently, the metal film 25 is first removed through etching by means of the reactive ion etching system using chlorine ($Cl_2$) and boron trichloride ($BCl_3$) as the etching gas with the above photoresist 17 as an etching mask to form the metal electrode 26.

Next, the n-type semiconductor layer 24, the intrinsic semiconductor layer 22, the buffer layer 20, the p-type semiconductor layer 18 and the silicon nitride film 16 laminated under the metal electrode 26 are self alignmently etched by means of the reactive ion etching system, using the above photoresist 17 and the metal electrode 26 as an etching mask and sulfur hexafluoride ($SF_6$), carbon tetrafluoride ($CF_4$) and oxygen ($O_2$) for the raw material gas. Thereafter, the photoresist 17 used for the etching mask is removed.

Consequently, the solar cell device 2 can be fabricated in which the 10 surface treatment layer 14 is formed on the transparent oxide electrode 12, on which the silicon nitride film 16 is formed, and layers from the p-type semiconductor layer 18, the buffer layer 20, the intrinsic semiconductor layer 22, the n-type semiconductor layer 24 to the metal electrode 26 are laminated in order as shown in FIG. 1.

The solar cell device 2 fabricated as above obtains the laminated structure in which the layers from the surface treatment layer 14 to the metal electrode 26 are laminated in order, after the tin iodide series compounds adhered during forming of the transparent oxide electrode 12, are removed by cleaning the surfaces of the insulating substrate 10 and the transparent oxide electrode 12, to obtain clean surfaces. Accordingly, the transmitted amount of light incident from the insulating substrate 10 is increased to obtain a required amount of transmitted light, thereby increasing electric power which can be taken out and improving output characteristics, in addition to preventing reduction in yield of the solar cell device 2.

It should be noted that although, in the above explanation, either the cleaning method with halogen gas having a saturated vapor pressure higher than that of etching gas used in etching of the transparent oxide electrode to form, or the cleaning method with pure water, is described as the method of cleaning the surfaces of the insulating substrate and the transparent oxide electrode, it is also natural to carry out both methods together.

The method of fabricating for the solar cell device provided with the surface treatment layer and the silicon nitride film on the surface of the transparent oxide electrode has been described. The fabricating method of the present invention can be applied not only to a case of fabricating the above structure but also to a solar cell device having a structure provided with only a surface treatment layer without a silicon nitride film or a solar cell device having a structure according to the conventional art without a surface treatment layer nor a silicon nitride film.

INDUSTRIAL APPLICABILITY

The fabricating method for the solar cell device according to the present invention obtains the laminated structure in which semiconductor layers are laminated after cleaning the surfaces of the insulating substrate and the transparent oxide electrode to which tin iodide series compounds adhere in forming the transparent oxide electrode are removed to obtain clean surfaces. Therefore, the insulating substrate and the transparent oxide electrode increase in transparency in correspondence with decrease of the tin iodide series compounds which are impurities by removing the same. Accordingly, the transmitted amount of light incident from the insulating substrate is increased to obtain a required amount of transmitted light, thereby increasing electric power which can be taken out and improving output characteristics, in addition to the prevention of reduction in yield of the solar cell device.

What is claimed is:

1. A fabricating method for a solar cell device, comprising the steps of:
   forming a transparent oxide electrode by etching a metal film formed on an insulating substrate;
   cleaning the surfaces of the insulating substrate and the transparent oxide electrode with halogen gas having a saturate vapor pressure higher than that of etching gas used in said step of forming the transparent oxide electrode;
   forming a p-type semiconductor layer, an intrinsic semiconductor layer, and an n-type semiconductor layer over the surface of the transparent oxide electrode in order; and
   forming a metal electrode on the n-type semiconductor layer.

2. The fabricating method for a solar cell device according to claim 1, further comprising the step of cleaning the surfaces of the insulating substrate and the transparent oxide electrode with pure water after or before said step of cleaning the surfaces of the insulating substrate and the transparent oxide electrode.

3. The fabricating method for a solar cell device according to claim 2, wherein said step of cleaning the surfaces of the insulating substrate and the transparent oxide electrode with pure water is the step of cleaning the insulating substrate and the transparent oxide electrode by rocking them in a water bath applied with ultrasound.

4. A fabricating method for a solar cell device, comprising the steps of:
   forming a transparent oxide electrode by etching a metal film formed on an insulating substrate;
   cleaning the surfaces of the insulating substrate and the transparent oxide electrode with pure water so as to dissolve and thereby remove a product produced by a reaction of etching gas and the metal film in the step of forming the transparent oxide electrode;
   forming a p-type semiconductor layer, an intrinsic semiconductor layer, and an n-type semiconductor layer over the surface of the transparent oxide electrode in order; and
   forming a metal electrode on the n-type semiconductor layer.

5. The fabricating method for a solar cell device according to claim 4, wherein said step of cleaning the surfaces of the insulating substrate and the transparent oxide electrode with pure water is the step of cleaning the insulating substrate and the transparent oxide electrode by rocking them in a water bath applied with ultrasound.

* * * * *